US009859093B2

(12) United States Patent
Nakahira et al.

(10) Patent No.: US 9,859,093 B2
(45) Date of Patent: Jan. 2, 2018

(54) METHOD OF IMPROVING QUALITY OF SCANNING CHARGED PARTICLE MICROSCOPE IMAGE, AND SCANNING CHARGED PARTICLE MICROSCOPE APPARATUS

(71) Applicant: Hitachi High-Technologies Corporation, Minato-ku, Tokyo (JP)

(72) Inventors: Kenji Nakahira, Tokyo (JP); Maki Tanaka, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/115,073

(22) PCT Filed: Dec. 3, 2014

(86) PCT No.: PCT/JP2014/082015
§ 371 (c)(1),
(2) Date: Jul. 28, 2016

(87) PCT Pub. No.: WO2015/122082
PCT Pub. Date: Aug. 20, 2015

(65) Prior Publication Data
US 2016/0343540 A1  Nov. 24, 2016

(30) Foreign Application Priority Data
Feb. 12, 2014 (JP) .................. 2014-024794

(51) Int. Cl.
*H01J 37/00* (2006.01)
*H01J 37/22* (2006.01)
*H01J 37/28* (2006.01)

(52) U.S. Cl.
CPC ............ *H01J 37/222* (2013.01); *H01J 37/22* (2013.01); *H01J 37/28* (2013.01); *H01J 2237/221* (2013.01); *H01J 2237/2809* (2013.01)

(58) Field of Classification Search
CPC .......... H01J 37/222; H01J 37/28; H01J 37/22; H01J 2237/2809; H01J 2237/221
(Continued)

(56) References Cited

U.S. PATENT DOCUMENTS 4,907,287 A   3/1990 Homma et al.
5,043,570 A   8/1991 Takabayashi
(Continued)

FOREIGN PATENT DOCUMENTS

JP   62-89170 A   4/1987
JP   3-44613 A    2/1991
(Continued)

OTHER PUBLICATIONS

International Search Report (PCT/ISA/210) issued in PCT Application No. PCT/JP2014/082015 dated Jan. 6, 2015 with English-language translation (two (2) pages).
(Continued)

Primary Examiner — Michael Maskell
(74) Attorney, Agent, or Firm — Crowell & Moring LLP

(57) ABSTRACT

A scanning charged particle microscope apparatus includes image quality improvement unit which performs an image quality improvement process on image data which is obtained by detecting particles generated from a sample, the image quality improvement unit divides a region in which the image data is acquired into two or more regions on the basis of a distance from a region in which the image data within a visual field of a charged particle optical unit is not acquired, determines an image quality improvement processing method and a processing parameter for image quality improvement for the image data in each of the separate regions according to the separate regions; and performs an image quality improvement process on the image data in each of the separate regions by using the determined processing method and processing parameter corresponding to the separate region.

14 Claims, 11 Drawing Sheets

(58) Field of Classification Search
USPC .................................. 250/306, 307, 310, 311
See application file for complete search history.

(56) References Cited

U.S. PATENT DOCUMENTS

| | | |
|---|---|---|
| 8,106,357 B2 | 1/2012 | Nakahira et al. |
| 9,019,362 B2 * | 4/2015 | Bai .................... H01J 37/244 |
| | | 250/307 |

FOREIGN PATENT DOCUMENTS

| | | |
|---|---|---|
| JP | 7-240166 A | 9/1995 |
| JP | 9-198498 A | 7/1997 |
| JP | 2007-107999 A | 4/2007 |
| JP | 2012-142299 A | 7/2012 |

OTHER PUBLICATIONS

Japanese-language Written Opinion (PCT/ISA/237) issued in PCT Application No. PCT/JP2014/082015 dated Jan. 6, 2015 (three (3) pages).

* cited by examiner

[Fig. 1]
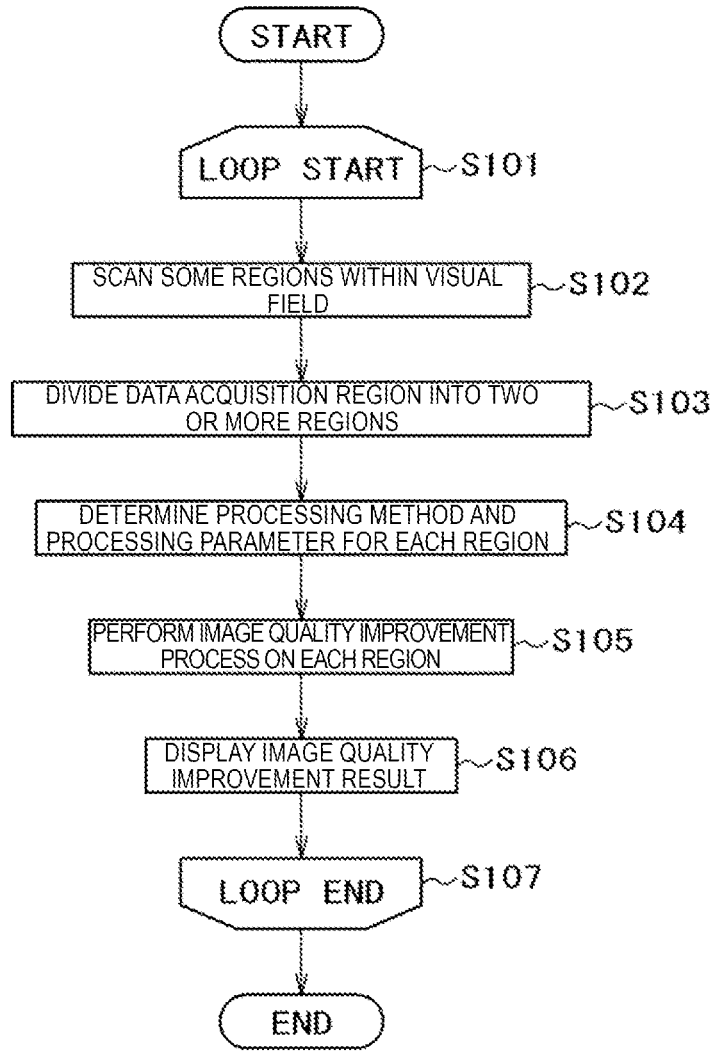

[Fig. 2A]
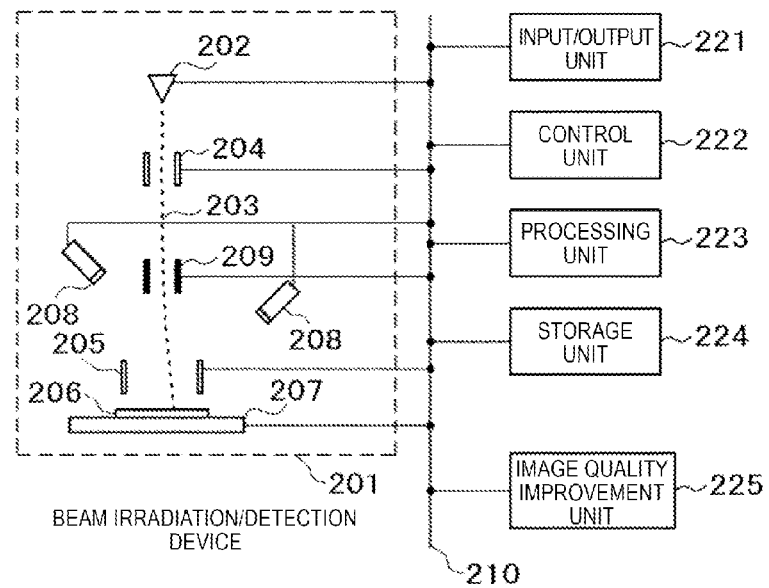
[Fig. 2B]
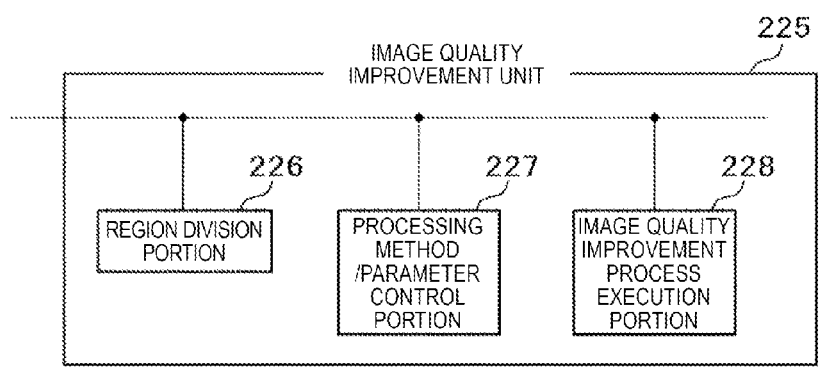

[Fig. 3]
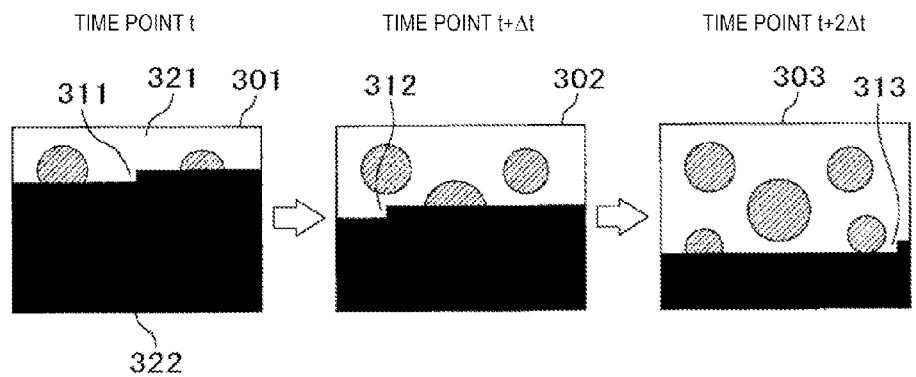
[Fig. 4A]
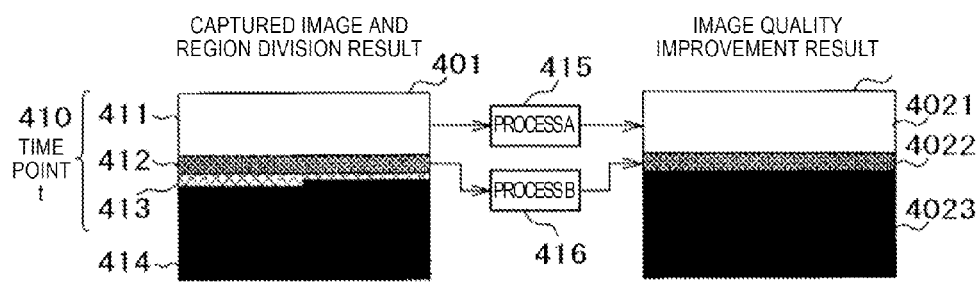
[Fig. 4B]
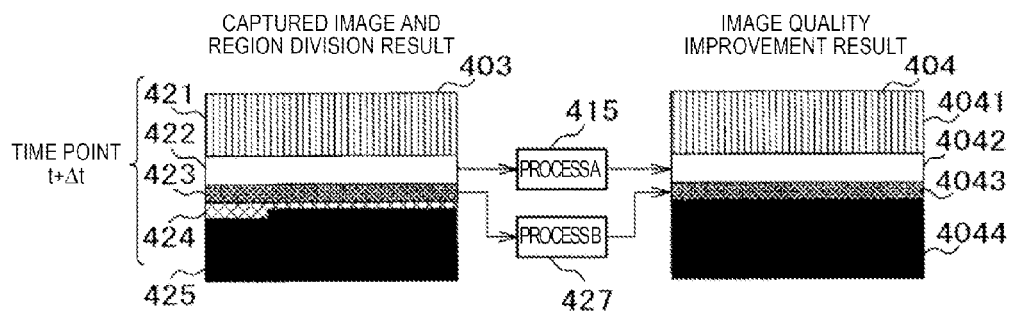
[Fig. 4C]
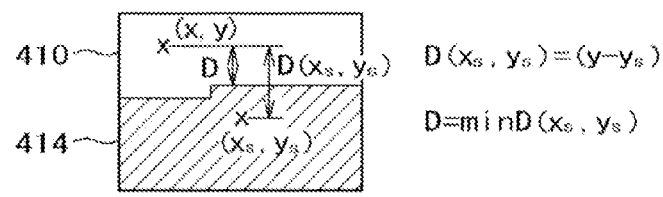

[Fig. 5A]
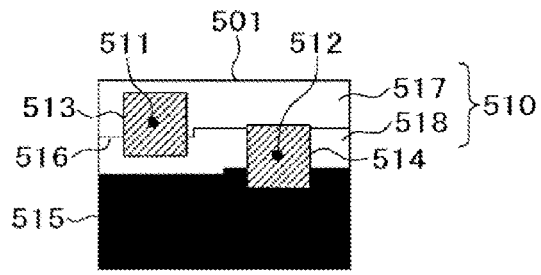
[Fig. 5B]
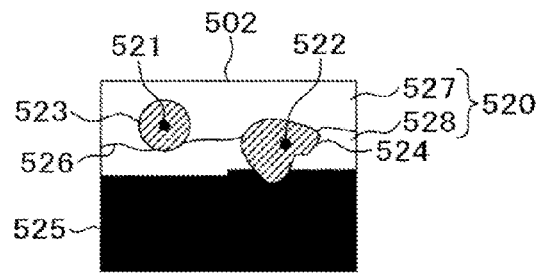
[Fig. 6A]
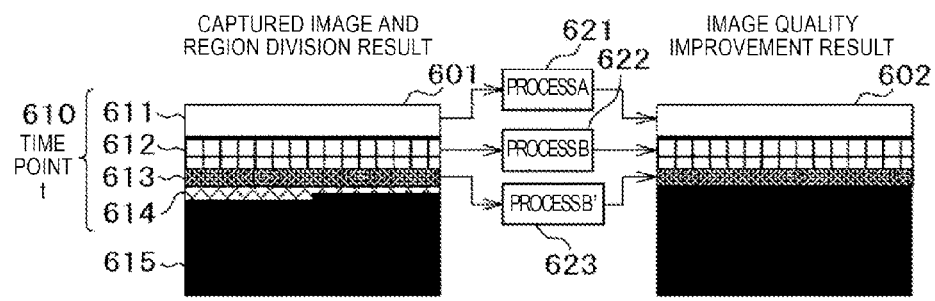
[Fig. 6B]
|  | PROCESS A | PROCESS B | PROCESS B' |
|---|---|---|---|
| ALGORITHM a | ○ | × | × |
| ALGORITHM b | ○ | ○ | × |
○ : NORMAL PROCESS
× : LATENT PROCESS

[Fig. 7]
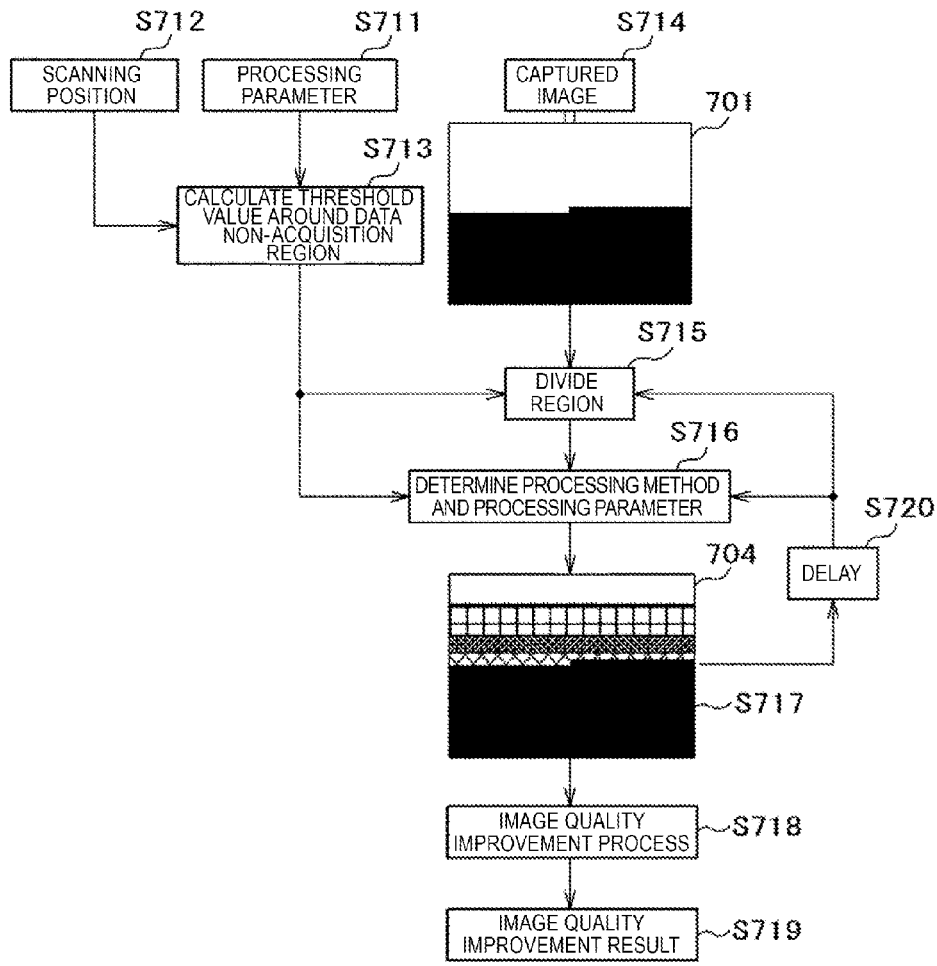
[Fig. 8A]
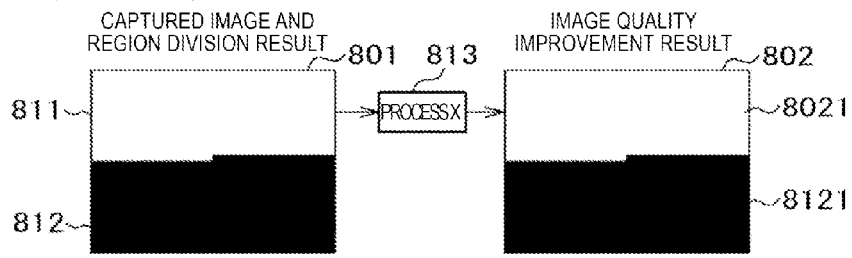

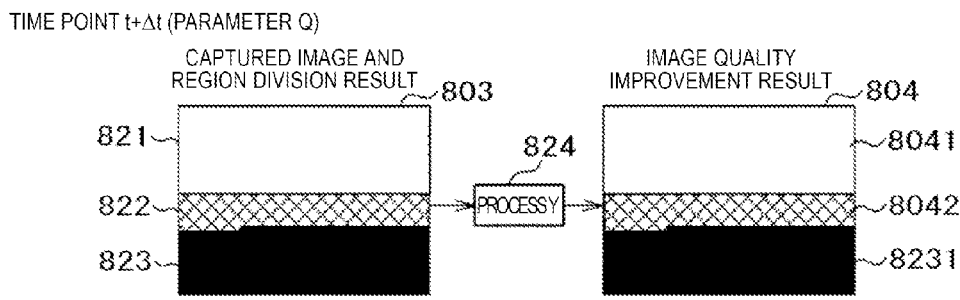
[Fig. 8B] TIME POINT t+Δt (PARAMETER Q)
[Fig. 8C] TIME POINT t+2Δt (PARAMETER Q)
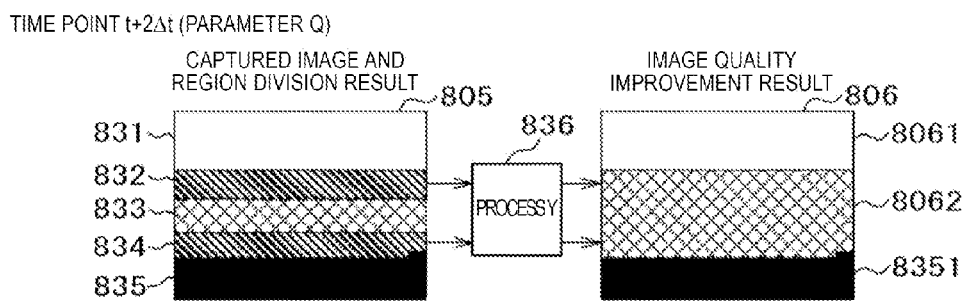
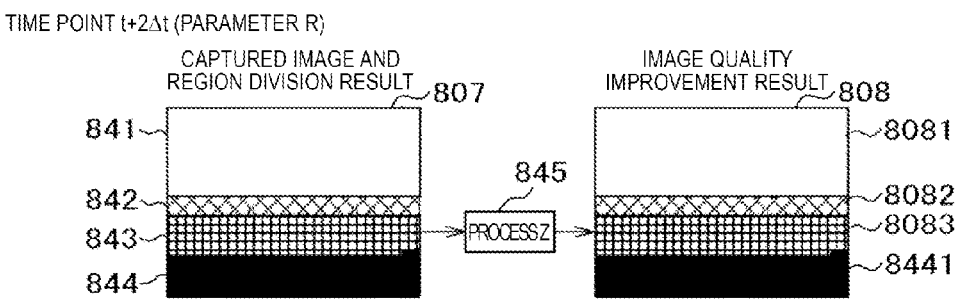
[Fig. 8D] TIME POINT t+2Δt (PARAMETER R)
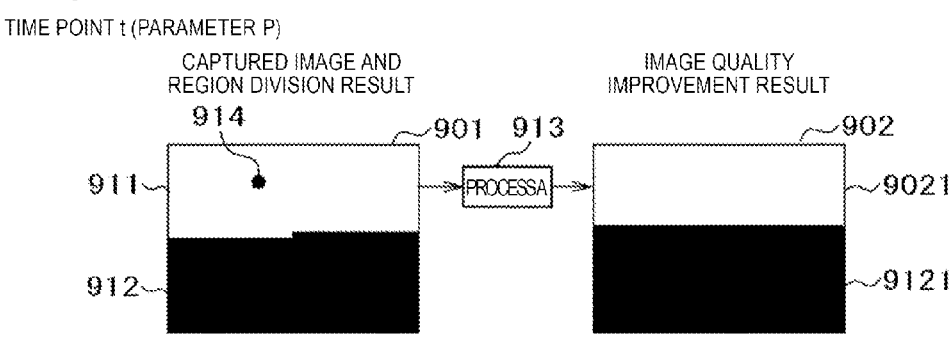
[Fig. 9A] TIME POINT t (PARAMETER P)

[Fig. 9B]
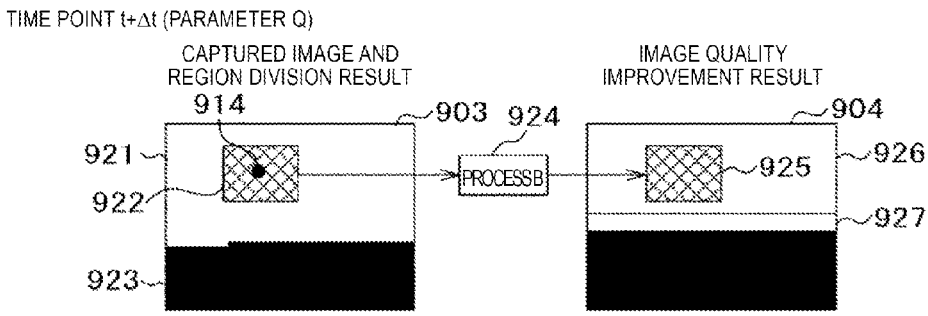
[Fig. 10]
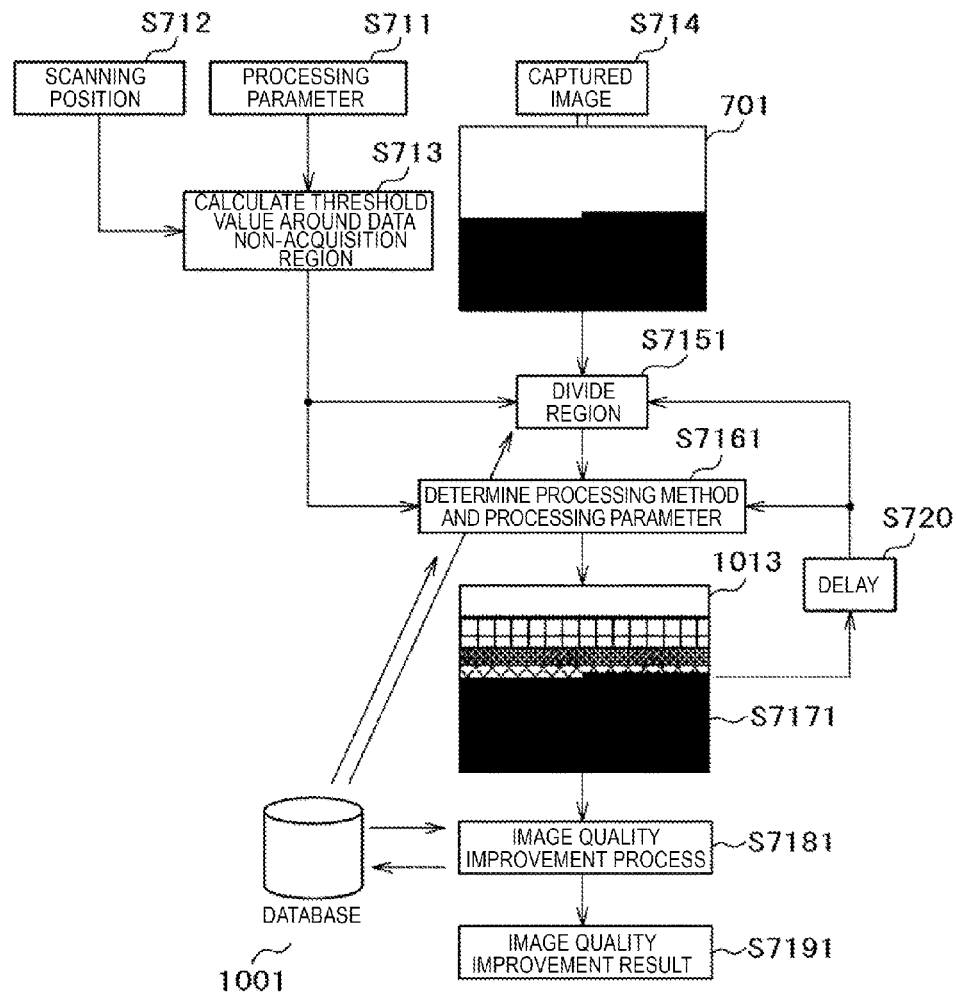

[Fig. 11A]
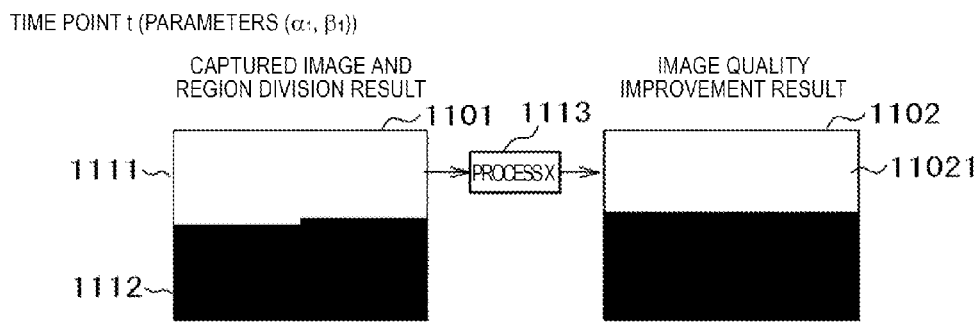
[Fig. 11B]
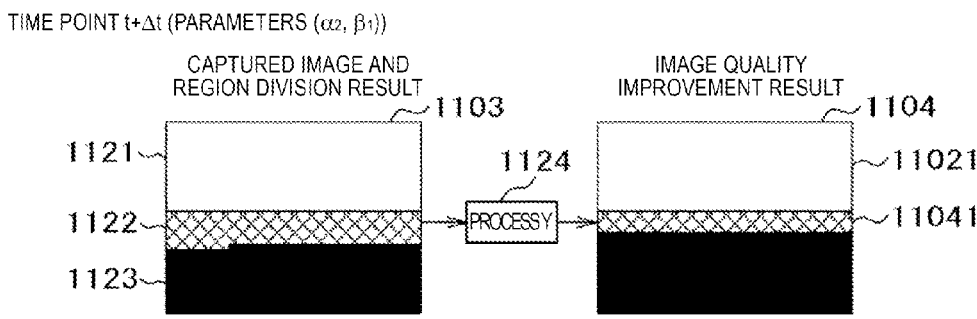
[Fig. 11C]
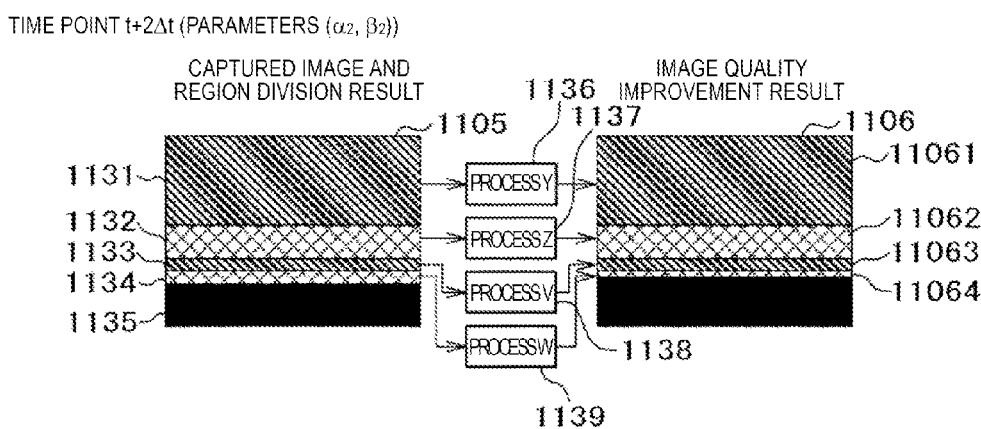

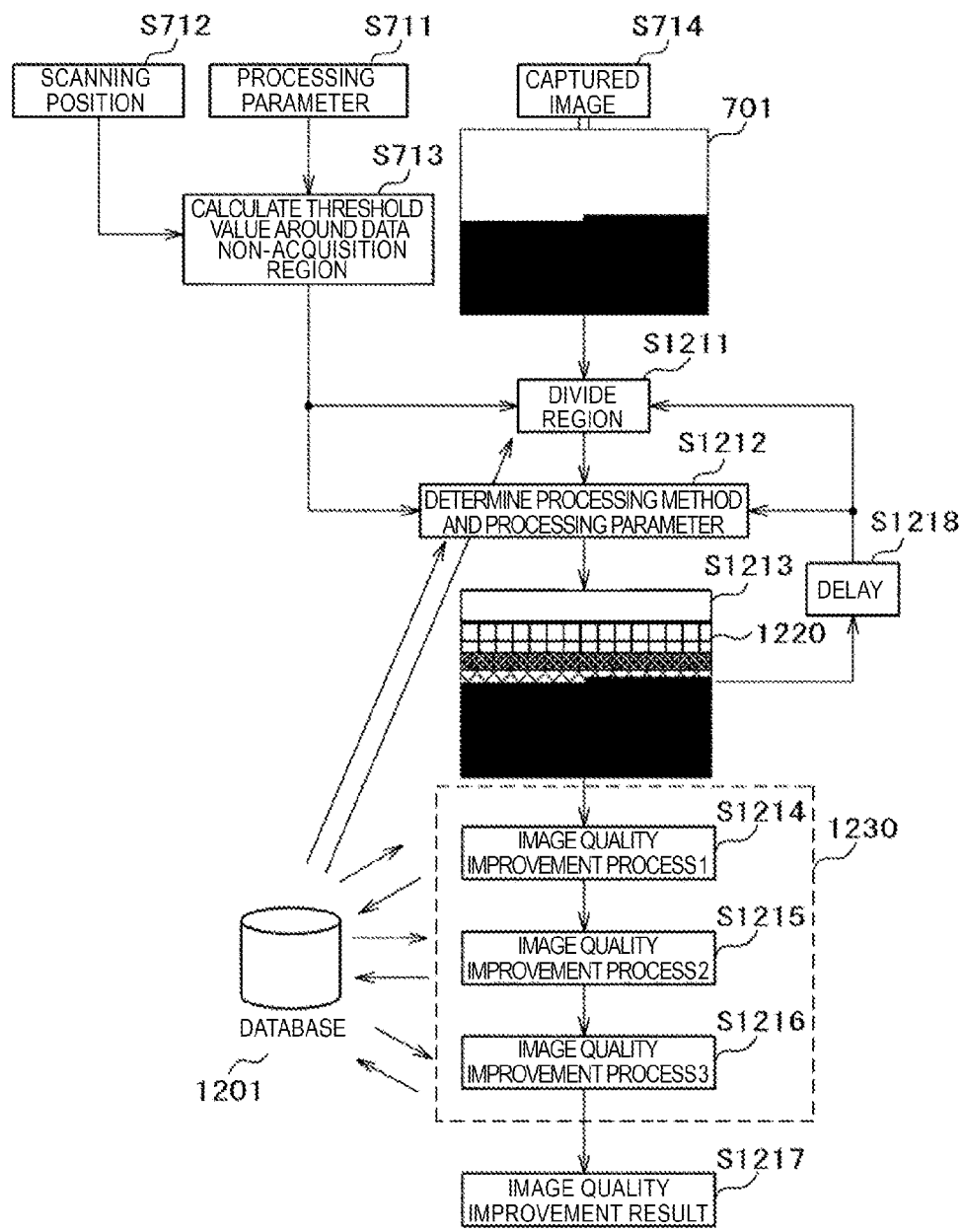
[Fig. 12]

[Fig. 13A]
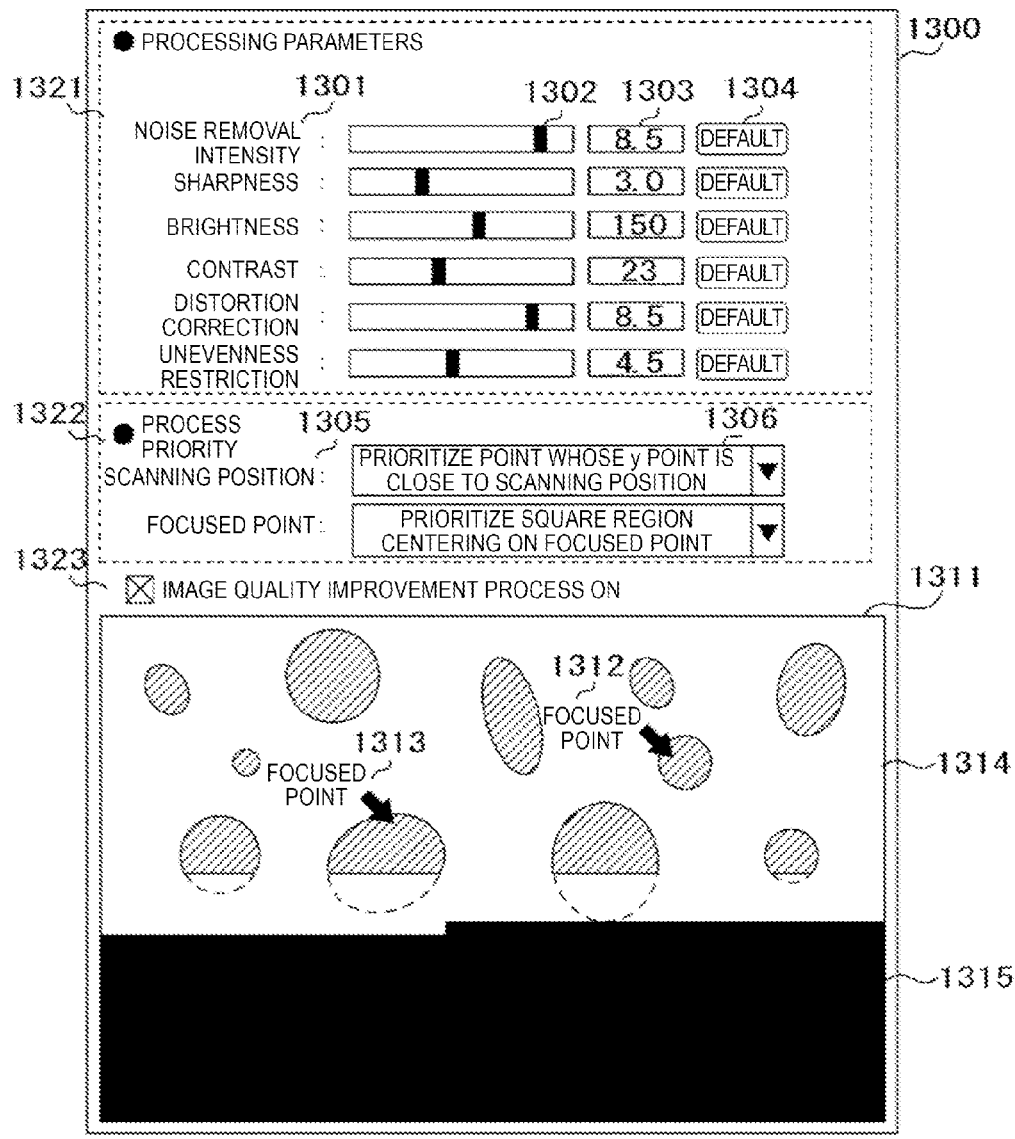

[Fig. 13B]
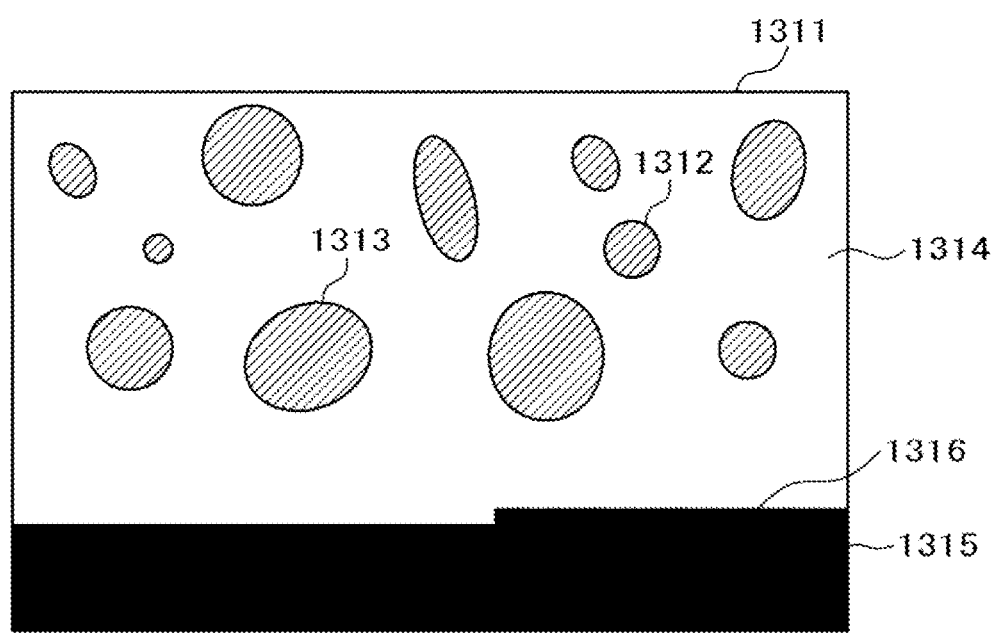

METHOD OF IMPROVING QUALITY OF SCANNING CHARGED PARTICLE MICROSCOPE IMAGE, AND SCANNING CHARGED PARTICLE MICROSCOPE APPARATUS

TECHNICAL FIELD

The present invention relates to a scanning charged particle microscope which irradiates a sample with charged particles so as to acquire an image, and particularly to a method of improving quality of a scanning charged particle microscope image in order to display an image with high visibility, and a scanning charged particle microscope apparatus.

BACKGROUND ART

A charged particle microscope has a still higher resolution than that of an optical microscope, and is thus widely used to clearly observe a fine structure of an observation target. In the charged particle microscope, a target sample is irradiated with a charged particle beam, particles (charged particles of the same kind as or the different kind from the applied charged particles, or electromagnetic waves or photons) which are emitted from the target sample or are transmitted through the target sample are detected with a detector, and thus an enlarged image of the target sample is acquired. A scanning charged particle microscope scans a sample with a focused charged particle beam. Examples of the microscope include a scanning electron microscope, a scanning ion microscope, and a scanning transmission electron microscope, and the microscope is used in various fields such as a material field, a semiconductor field, a food field, a biotechnology field, and a medical field.

There is an S/N ratio or a resolution as a major index related to quality of a scanning charged particle microscope image. In order to achieve a high S/N ratio or a high resolution, an electron optical system or a detection system has been continuously improved in the related art. A sufficient amount of charged particle beams are required to be applied to a sample in order to achieve a high S/N ratio in principle, but if an irradiation amount is increased, this causes a problem such as a reduction in throughput. Also in achievement of a high resolution, a resolution of the present scanning charged particle microscope comes close to a diffraction limit which is a physical restriction, and thus it is fundamentally difficult to considerably improve the resolution.

In relation to these problems, in recent years, achievement of high image quality through image processing has been examined. A signal component and noise included in an image are identified from each other, and it can be expected that a high S/N ratio is realized through a noise removal process for reducing the noise (for example, PTL 1). In addition, a deconvolution process is performed on the basis of an intensity distribution of a charged particle beam on a sample, which has the great influence on a resolution of an image, and thus the resolution can be improved (for example, PTLs 2 and 3). Further, as processes of achieving high image quality from the viewpoint different from an S/N ratio or a resolution, a method of appropriately setting contrast or reducing distortion of an image or vibration (for example, PTLs 4 and 5).

In relation to a method of capturing a charged particle microscope image, there is a high-speed scan mode in which an image is acquired by combining one or more image data items within the same visual field, obtained through high speed scanning, and a low-speed scan mode in which scanning is performed over time. In the high-speed scan mode, image blurring occurs due to vibration or the like of an applied charged particle beam. On the other hand, in the low-speed scan mode, such blurring can be prevented, but a long time such as several tens of seconds is required to capture a single image. Both of the modes are widely used, and are used depending on an application or purpose. In addition, there is an increasing demand for high image quality in both of the modes.

CITATION LIST

Patent Literature

PTL 1: JP-A-2007-107999
PTL 2: JP-A-3-44613
PTL 3: JP-A-2012-142299
PTL 4: JP-A-7-240166
PTL 5: JP-A-62-89170

SUMMARY OF INVENTION

Technical Problem

Hereinafter, a description will be made of a case where scanning is performed in a horizontal direction from an upper left position on an image to a lower right position thereon (raster-scan), but the present invention is not limited thereto. Since it takes time to capture an image in a low-speed scan mode, an image is often displayed during scanning instead of displaying the image after completion of image capturing. In this case, an image is sequentially displayed from the upper left position on the image at which the scanning is completed. An operator performs an operation of adjusting an imaging condition of a scanning charged particle microscope, such as focus or stigma, changing an imaging position, or stopping imaging, while viewing an image during scanning in order to image a target desired to be imaged with as high image quality as possible. In order to accurately perform determination thereof, it is preferable to rapidly display a result of image quality improved through image processing on an image during scanning.

However, if a normal image quality improvement process is performed on an image during scanning, an unnatural result such as generation of a pseudo-pattern may be obtained in a region around a scanning position where data enough to perform the process is not obtained yet.

In addition, in the low-speed scan mode, an image with multiple pixels such as several tens of millions of pixels is often captured. In this case, if an image quality improvement process is desired to be performed on an image during scanning, for example, at intervals of 100 milliseconds, the process is required to be performed at a speed of several millions of pixels per second. Thus, an image quality improvement process with less calculation is performed at the sacrifice of performance, or an expensive processing device is required to be used in order not to sacrifice the performance.

There is also a need for changing an image processing parameter (hereinafter, referred to as a processing parameter) during scanning. There may be a method of adjusting the processing parameter after scanning is completed, but, in this case, an intended image may not be obtained only by adjusting a processing parameter, and it may be revealed after scanning is completed that imaging is required to be performed again. Thus, considerable rework may be performed.

In order to efficiently capture an image without performing considerable rework, a processing parameter is preferably adjusted by using an image during scanning. However, as described above, especially, in an image with multiple pixels, it takes time to perform an image quality improvement process, and, thus, even if the processing parameter is changed, a result thereof cannot be reflected immediately.

The present invention provides a method of improving quality of a scanning charged particle microscope image and a scanning charged particle microscope apparatus, capable of solving the above-described problems of the related art, generating an image with high visibility, and immediately displaying the image.

Solution to Problem

In order to solve the problems of the related art, according to the present invention, there is provided a method of improving image quality of an image obtained by imaging a sample with a scanning charged particle microscope, the method including a scan step of imaging the sample while scanning and irradiating some regions of the sample within an imaging visual field of the scanning charged particle microscope with a focused charged particle beam, so as to sequentially acquire image data of the sample; a region division step of dividing a region in which the image data is acquired into two or more regions among regions within the imaging visual field of the scanning charged particle microscope which sequentially acquires the image data in the scan step, on the basis of a distance from a region in which the image data is not acquired; a processing method and a processing parameter determining step of determining an image quality improvement processing method and a processing parameter for image quality improvement according to the regions obtained through the division in the region division step for the image data in each of the separate regions; an image quality improvement step of performing an image quality improvement process on the image data in each region obtained through the division in the region division step by using the processing method and the processing parameter corresponding to the separate region, determined in the processing method and the processing parameter determining step; and an image quality improvement result display step of displaying an image having undergone the image quality improvement process in the image quality improvement step, in which steps from the scan step to the image quality improvement result display step are iterated until scanning of a region of the sample within the visual field of the scanning charged particle microscope is completed.

In addition, in order to solve the problems of the related art, according to the present invention, there is provided a scanning charged particle microscope apparatus including charged particle irradiation optical system means for irradiating and scanning a sample with focused charged particles; detection optical system means for detecting particles of the same kind or different kinds generated from the sample which is irradiated with the charged particles by the charged particle irradiation optical system means; image quality improvement means for performing an image quality improvement process on image data which is obtained by the detection optical system means detecting the particles generated from the sample; and image display means for displaying a result of the image quality improvement process, in which the image quality improvement means iterates, on image data within an imaging visual field acquired by the charged particle optical system means scanning and irradiating the sample with focused charged particles, dividing a region in which the image data is acquired into two or more regions on the basis of a distance from a region in which the image data within the visual field is not acquired; determining an image quality improvement processing method and a processing parameter for image quality improvement for the image data in each of the separate regions according to the separate regions; and performing an image quality improvement process on the image data in each of the separate regions by using the determined processing method and processing parameter corresponding to the separate region.

Advantageous Effects of Invention

According to the present invention, it is possible to perform an image quality improvement process on an image during scanning in the scanning charged particle microscope. In addition, a high quality image in which a pseudo-pattern is reduced can be obtained in a small amount of calculation, a process is preferentially performed from a focused region, and thus high usability can be realized.

BRIEF DESCRIPTION OF DRAWINGS

FIG. 1 is a diagram illustrating one Example of a sequence of performing an image quality improvement process on data during scanning.

FIG. 2A is a block diagram illustrating a fundamental configuration of a scanning charged particle microscope according to Example 1 of the present invention.

FIG. 2B is a block diagram illustrating a specific configuration of an image quality improving unit of the scanning charged particle microscope according to Example 1 of the present invention.

FIG. 3 is a diagram illustrating a screen displaying data during scanning at each time point.

FIG. 4A is a front view of an image at a time point t, illustrating a method of performing an image quality improvement process by dividing a data acquired region into two or more regions on the basis of a distance from a data non-acquired region according to Example 1 of the present invention.

FIG. 4B is a front view of an image at a time point t+Δt, illustrating a method of performing an image quality improvement process by dividing a data acquired region into two or more regions on the basis of a distance from a data non-acquired region according to Example 1 of the present invention.

FIG. 4C is a front view of an image for explaining definition of a distance between a focused point of a data acquired region and a data non-acquired region according to Example 1 of the present invention.

FIG. 5A is a diagram for explaining a region for acquiring data enough to perform a normal image quality improvement process, and is a front view of an image, illustrating a case where a data acquired region is square or rectangular.

FIG. 5B is a diagram for explaining a region for acquiring data enough to perform a normal image quality improvement process, and is a front view of an image, illustrating a case where a data acquisition region is not square or rectangular.

FIG. 6A is a front view of an image, illustrating another Example which is different from a case of FIG. 4A or FIG.

4B illustrating a method of performing an image quality improvement process by dividing a data acquired region into two or more regions on the basis of a distance from a data non-acquired region according to Example 1 of the present invention.

FIG. 6B is a table illustrating combinations of the image quality improvement process and an image processing algorithm according to Example 1 of the present invention.

FIG. 7 is a flow diagram illustrating a process flow for the method of performing an image quality improvement process by dividing a data acquired region into two or more regions on the basis of a distance from a data non-acquired region according to Example 1 of the present invention.

FIG. 8A is a diagram for explaining an image quality improvement process according to Example 2 of the present invention, and is a front view of an image illustrating a result of performing the image quality improvement process by using a processing parameter P at a time point t.

FIG. 8B is a diagram for explaining an image quality improvement process according to Example 2 of the present invention, and is a front view of an image illustrating a result of performing the image quality improvement process by using a processing parameter Q at a time point t+Δt.

FIG. 8C is a diagram for explaining an image quality improvement process according to Example 2 of the present invention, and is a front view of an image illustrating a result of performing the image quality improvement process by using the processing parameter Q at a time point t+2Δt.

FIG. 8D is a diagram for explaining an image quality improvement process according to Example 2 of the present invention, and is a front view of an image illustrating a result of performing the image quality improvement process by using a processing parameter R at the time point t+2Δt.

FIG. 9A is a diagram for explaining an image quality improvement process according to Example 2 of the present invention, and is a front view of an image illustrating a result of performing the image quality improvement process by using the processing parameter Q at the time point t and illustrating a case where a focused point 914 is designated.

FIG. 9B is a diagram for explaining an image quality improvement process according to Example 2 of the present invention, and is a front view of an image illustrating a result of performing the image quality improvement process by using the processing parameter Q in a peripheral region 922 of the focused point 914 at the time point t+Δt.

FIG. 10 is a flow diagram illustrating a process flow for a method of performing an image quality improvement process by dividing a data acquired region into two or more regions on the basis of a distance from a data non-acquired region according to Example 2 of the present invention.

FIG. 11A is a diagram for explaining an image quality improvement process according to Example 2 of the present invention, and is a front view of an image, illustrating a result of performing the image quality improvement process in a process X by using a plurality of processing parameters ($\alpha_1$, $\beta_1$) of different types at a time point t.

FIG. 11B is a diagram for explaining an image quality improvement process according to Example 2 of the present invention, and is a front view of an image, illustrating a result of performing the image quality improvement process in a process Y by using a plurality of processing parameters ($\alpha_2$, $\beta_1$) of different types at a time point t+Δt.

FIG. 11C is a diagram for explaining an image quality improvement process according to Example 2 of the present invention, and is a front view of an image, illustrating a result of performing the image quality improvement process in a different process for each region by using a plurality of processing parameters ($\alpha_2$, $\beta_2$) of different types at a time point t+2Δt.

FIG. 12 is a flow diagram illustrating a process flow for a method of realizing the process described in FIG. 11 in the method of performing an image quality improvement process by dividing a data acquired region into two or more regions on the basis of a distance from a data non-acquired region according to Example 2 of the present invention.

FIG. 13A is a diagram illustrating one Example of a GUI screen related to an image quality improvement process on an image during scanning according to Example 2 of the present invention.

FIG. 13B is a diagram illustrating a GUI screen related to an image quality improvement process on an image during scanning according to Example 2 of the present invention, the GUI screen displaying an image after a predetermined period of time elapses from the case illustrated in FIG. 13A.

DESCRIPTION OF EMBODIMENTS

The present invention relates to a scanning charged particle microscope which irradiates a sample with charged particles so as to acquire an image, and particularly provides a method of processing a scanning charged particle microscope image and an image processing apparatus capable of displaying an image with high visibility. Hereinafter, embodiments of the present invention will be described with reference to the drawings.

In the present invention, the above-described problems are solved by the following method of improving a scanning charged particle microscope image and the following scanning charged particle microscope apparatus.

(1) The present invention is characterized in that a data acquired region of an image is divided into two or more regions on the basis of a distance from a data non-acquired region, and a processing method or a processing parameter is determined for each region. Consequently, the data acquired region is divided into a region (that is, a region around a data non-acquired region) in which data enough to perform a process is not acquired, and a remaining region, that is, a region in which data enough to perform a process is acquired. For example, a process in which an unnatural result is reduced but the extent of image quality improvement is low is performed on the former region as a tentative process, and a normal image quality improvement process is performed on the latter region. Consequently, a favorable image can be obtained as a whole by combining a plurality of processes.

(2) In addition, the present invention is characterized in that a new image quality improvement process is not performed on one or more regions among two or more separate regions, and a past process result is used. Particularly, a past process result is used for a region which is present in a region separated from a data non-acquired region and has no great change relative to a result of a past image quality improvement process. Consequently, it is possible to improve the problem that a processing time is lengthened as a result of performing an image quality improvement process on all acquired data. A processing target region is minimized, and thus a process result can be rapidly displayed by reducing a processing time for the image quality improvement process.

(3) Further, the present invention is characterized in that, in a case where a processing parameter is changed during scanning, a process is performed again not only on new data acquired after the processing parameter is changed but also on data acquired before the processing parameter is changed, by using the changed processing parameter. Still further, the present invention is characterized in that the priority is given to a processing region, and a process is sequentially performed in order of the high priority. In a case where an imaging condition such as a focal position is changed during scanning, data which has already been acquired cannot be replaced with an image after the imaging condition is changed. However, in a case where an image processing parameter is changed, it is possible to perform a position using the changed processing parameter on data which has already been acquired according to the present invention. For example, in a case where a processing parameter is changed after a large amount of data is acquired, a lot of time may be taken if a process is to be performed again on all the acquired data by using the changed processing parameter. In this case, a process is preferentially performed from a region on which a user focuses (or a region on which the user easily focuses), and thus the problem that usability is reduced due to time delay is prevented.

(4) In addition, the present invention is characterized in that an interim result of an image quality improvement process is preserved, and a process is performed on one or more regions obtained through division by using the interim result. In a case where a processing parameter is changed on the way, an image quality improvement result may be obtained in a small amount of calculation by using an interim result even if an image quality improvement process is not performed from the beginning depending on the type of processing parameter. Further, in a case where a plurality of types of processing parameters are changed, it is possible to perform an image quality improvement process with high efficiency as in Example which will be described later.

Example 1

FIG. 1 is a diagram illustrating one Example of a sequence of performing an image quality improvement process on data acquired with a detector while a sample surface is being scanned with charged particles in the present invention. Steps S101 to S107 are iterated until image data corresponding to a single image is acquired and is displayed.

In step S102, some regions within a visual field are scanned, and thus a part of image data is obtained. An amount of data acquired through one loop is defined depending on a scanning speed or a display rate. For example, in a case where time for obtaining image data corresponding to a single image, that is, time for scanning all regions within the visual field is set to 60 seconds, and a display rate is set to 50 milliseconds, an amount of data corresponding to 1/1200 of image data may be acquired through one loop.

In step S103, a data acquired region is divided into two or more regions on the basis of a distance from a data non-acquired region. In step S104, an image quality improvement processing method and a processing parameter are determined for each of the regions obtained through the division in step S103. In step S105, an image quality improvement process is performed on each region by using the processing method and the processing parameter determined in step S104. In step S106, an image quality improvement result is displayed.

FIG. 2A is a block diagram illustrating a fundamental configuration of a scanning charged particle microscope 200 in the present example. The scanning charged particle microscope 200 is configured to include, for example, a charged particle image acquisition device 201, an input/output unit 221, a control unit 222, a processing unit 223, a storage unit 224, an image quality improvement unit 225, and the like.

In the charged particle image acquisition device 201, a charged particle beam 203 is generated from a charged particle gun 202, and the charged particle beam 203 is focused on a surface of a sample 206 through a condenser lens 204 or an objective lens 205. Next, particles generated from the sample 206 are detected by detectors 208, and thus an image is acquired. The image is preserved in the storage unit 224.

The detectors 208 may be provided in plurality, may be detectors detecting different particles, such as a detector detecting an electron and a detector detecting an electromagnetic wave, may be detectors detecting only particles whose energy or spin directions are within a specific range, and may be detectors detecting particles with different properties, such as a secondary charged particle detector and a backscattering charged particle detector. A plurality of detectors detecting particles having the same property may be provided to be disposed at different positions. Normally, in a case where a plurality of detectors 208 are provided, a plurality of images can be obtained through one imaging.

The sample 206 is mounted on a stage 207, and an image at any position on the sample can be acquired by moving the stage 207. A direction of the charged particle beam 203 is changed in a two-dimensional manner by a beam deflector 209, and the sample 206 can be scanned with the charged particle beam 203.

The input/output unit 221 inputs an image capturing position or an imaging condition, and displays and outputs an image and an image processing result on a screen. The control unit 222 controls voltages applied to the charged particle gun 202 and the like, focal positions of the condenser lens 204 and the objective lens 205, a position of the stage 207, the extent to which the charged particle beam 203 is deflected by the beam deflector 209, and the like, in relation to control on the charged particle image acquisition device 201. In addition, the control unit 222 also controls the input/output unit 221, the processing unit 223, the storage unit 224, and the image quality improvement unit 225.

The processing unit 223 performs various processes, for example, a process regarding automatic focusing which is necessary in order to focus the charged particle beam 203 on the surface of the sample 206 mounted on the stage 207. The storage unit 224 preserves a captured image, an image quality-improved image, an interim result in an image quality improvement process, various processing parameters, and the like. The image quality improvement unit 225 performs an image quality improvement process on acquired data.

The image quality improvement unit 225 includes a region division portion 226, a processing method/parameter control portion 227, and an image quality improvement process execution portion 228, as a specific configuration thereof is illustrated in FIG. 2B. The region division portion 226 performs the process in step S103, that is, a process of dividing a data acquired region into two or more regions. The processing method/parameter control portion 227 performs the process in step S104, that is, a process of determining a processing method for an image quality improvement process including a noise removal process or a sharpening process, and a parameter for each region obtained through the division in step S103. The image quality improvement process execution portion 228 performs an image quality improvement process on the basis of information regarding each separate region obtained through the division in step S103, and a processing method and a parameter corresponding to the separate region.

FIG. 3 is a diagram illustrating a screen displaying image data detected and obtained by the detector 208 during scanning of the surface of the sample 206 with the charged particle beam 203. Images 301 to 303 are respectively image display screens at time points t, t+Δt and t+2Δt (Δt>0). At the time point t, scanning is performed up to a position 311, and an upper side of the position 311 or a region 321 on a direct left side of the position 311 is a data acquired region. In this region, data is acquired, and thus an image can be displayed. On the other hand, remaining regions, that is, a lower side of the position 311, or a black region 322 on a direct right side of the position 311 is a data non-acquired region. In this region, data is not acquired yet, and thus an image cannot be displayed.

At the time point t+Δt, scanning is performed up to a position 312, and a data acquired region is wider than at the time point t. At the time point t+2Δt, scanning is performed up to a position 313, and a data acquired region is further widened. As mentioned above, the data acquired region is widened as time elapses from the starting of the scanning. Consequently, the number of pixels requiring an image quality improvement process also increases.

First, with reference to FIGS. 4A to 7, a description will be made of a method of dividing a data acquired region into two or more regions on the basis of a distance from a data non-acquired region and changing a processing method or parameter for each region in a first embodiment.

FIGS. 4A and 4B are diagrams illustrating examples of methods of dividing a data acquired region into two or more regions on the basis of a distance from a data non-acquired region and performing an image quality improvement process.

An image 401 illustrated in FIG. 4A corresponds to a captured image and a region division result at a certain time point t. A region 414 (black region) is a data non-acquired region. A data acquired region 410 (a region obtained by combining regions 411, 412 and 413) in the image 401 is divided on the basis of a distance from the data non-acquired region 414.

There may be several methods of defining a distance from the data non-acquired region 414. In the present example, as illustrated in FIG. 4C, a case is assumed in which a distance D(xs,ys) between a position (x,y) in the data acquired region 410 and any position (xs,ys) in the data non-acquired region 414 is defined as a difference between y coordinates thereof, that is, |y−ys|, and the minimum value, that is, min D(xs,ys) of distances D(xs,ys) between the position (x,y) in the data acquired region 410 and all positions (xs,ys) in the data non-acquired region 414 is used as a distance D from the data non-acquired region.

As other definitions regarding a distance from the data non-acquired region 414, there may be cases where a Euclid distance $\{(x-xs)^2+(y-ys)^2\}^{1/2}$, a Manhattan distance $|x-xs|+|y-ys|$, a distance $\{(x-xs)^p+(y-ys)^p\}^{1/p}$ obtained by generalizing the distances, or a distance (for example, a geodesic line distance) in which a brightness value of each pixel is taken into consideration is employed. Alternatively, the distance may be a value from a plurality of distances computed according to a plurality of methods, for example, a smaller value of the Euclid distance and the Manhattan distance may be used as the distance.

Two threshold values $T_1$ and $T_2$ ($T_1<T_2$) are set for the distance D from the position (x,y) in the data acquired region to the data non-acquired region 414. In FIG. 4A, a region in which the distance D is equal to or more than $T_2$ is referred to as a region A411, a region in which the distance D is equal to or more than $T_1$ and is less than $T_2$ is referred to as a region B412, and a region in which the distance D is less than $T_1$ is referred to as a region C413.

The region A411 is a region in which all data enough to perform a normal image quality improvement process are acquired, and the normal image quality improvement process can be performed. Here, the normal image quality improvement process indicates not being a tentative image quality improvement process which will be described later.

The region B412 is a region in which some data is insufficient to perform the normal image quality improvement process (that is, there is data which is not acquired), and it is necessary to perform the tentative image quality improvement process. Here, the tentative image quality improvement process indicates a process in which the extent of image quality improvement is lower than a process performed in a case where there is no data non-acquired region, for example, by performing a weak image quality improvement process or skipping some processes.

The process in which the extent of image quality improvement is low indicates, for example, a process in which a filter size is small, the number of times of repetition is reduced, or a restriction is provided so that a brightness value is not rapidly changed. The extent of image quality improvement may be changed by changing an image quality improvement method, for example, by performing nonlinear filtering in which a high performance result can be expected in the normal process, and performing linear filtering in the tentative process.

The region C413 is a region in which there is a high probability that a favorable result may not be obtained even if the tentative process is performed, and a pseudo-pattern or the like may be generated.

In the present example, the data acquired region is divided into the regions 411 to 413, and a process 415 including a single or a plurality of processing algorithms corresponding to the normal image quality improvement process is performed on the region 411. In addition, a process 416 including a single or a plurality of processing algorithms corresponding to the tentative image quality improvement process is performed on the region 412. Further, the image quality improvement process is not performed on the region 413, and is not displayed either. In other words, the region 413 is treated in the same manner as the data non-acquired region 414 (for example, both of the region 413 and the data non-acquired region 414 are displayed black). The region 413 often has a small size to the extent of several lines in a vertical direction of an image, and thus there is no problem in most of applications even if the region 413 is treated in the same manner as the data non-acquired region 414.

Through this process, respective process results are displayed in regions 4021 and a region 4022 as in an image 402 obtained as a result of the image quality improvement. On the other hand, the region 413 and the data non-acquired region 414 in the image 401 are all displayed black as an unprocessed region 4023 in the image 402.

As mentioned above, since a data acquired region is divided into two or more regions on the basis of a data non-acquired region, a processing method or parameter is determined for each region, and an image quality improvement process is performed, it is possible to output a natural and high quality image in which a pseudo-pattern or the like is not generated in any region.

There may be a case where an image appears to be broken, for example, since a brightness value is discontinuity at a boundary (for example, a boundary between the region 4021 and the region 4022) between separate regions. Therefore, a division process may be performed so that each region has an overlapping region, and an interpolation process may be performed on the overlapping region.

On the other hand, an image 403 illustrated in FIG. 4B corresponds to a captured image and a region division result at a time point t+Δt after the image 401 illustrated in FIG. 4A is acquired. It is assumed that an image quality improvement process is performed in the image 401 acquired at the time point t illustrated in FIG. 4A, and then an image quality improvement process is performed in the image 403 acquired at the time point t+Δt illustrated in FIG. 4B.

In the image 403, a data acquisition region is divided into five regions such as regions 421 to 425. The same processes as those on the regions 411 to 413 in the image 401 illustrated in FIG. 4A are respectively performed on the region 422, the region 423, and the region 424. The region 425 is a data non-acquired region.

The region 421 is a region on which a process is not necessary (process unnecessary region), and is the same as the region 411 determined at the time point where the image 401 illustrated in FIG. 4A is acquired. The process A 415 (that is, a normal image quality improvement process) is performed on this region in the image 401, and thus the same result is obtained even if the same process A 415 is performed in the image 403 illustrated in FIG. 4B, acquired at the time point t+Δt. Thus, an image quality improvement process is not required to be performed on the region 421 in the image 403 again, and the process result of the image 402 is used as it is.

In an image 404 obtained as a result of improving image quality of the image 403, a result of performing the process A 415 or the process A 426 which is a normal image quality improvement process is displayed with respect to a process unnecessary region 4041 and a region 4042, and the process B 427 which is a tentative image quality improvement process is displayed with respect to a region 4043. A region 4044 is an unprocessed region.

As mentioned above, the process unnecessary region 4041 is extracted, and is excluded from regions on which the process A 426 which is the present image quality improvement process is performed by using the data based on the previously performed image quality improvement process. Consequently, it is possible to improve the problem that a processing time is lengthened as a result of performing an image quality improvement process while overlapping some regions with each other every time for all acquired data. A processing target region is minimized, and thus a process result can be rapidly displayed.

FIGS. 5A and 5B are diagrams for explaining regions in which data enough to perform a normal image quality improvement process is to be acquired. In an image 501 illustrated in FIG. 5A, a region 510 indicates a region in which image data is acquired (image data acquired region 510), and a region 515 indicates a region in which image data is not acquired (image data non-acquired region 515).

A region 513 indicates a data region which is necessary in order to perform a normal image quality improvement process at a pixel 511. The region 513 is a square whose size of one side is several pixels or more, but a shape of this data region is defined depending on the content of an image quality improvement process algorithm. For example, in two-dimensional calculation based on a finite filter coefficient of a moving average filter or the like, or a median filter, this data region often has a square shape or a rectangular shape. A region 514 indicates a data region which is necessary in order to perform a normal image quality improvement process at a pixel 512.

The region 513 does not have a common portion with the image data non-acquired region 515 (that is, the entire region 513 is included in the image data acquired region 510), and thus includes all data which are necessary in order to perform a process A 415 or 426 which is a normal image quality improvement process. Thus, the process A 415 or 426 which is a normal image quality improvement process can be performed on the pixel 511.

On the other hand, since a part of the region 514 overlaps the image data non-acquired region 515, some data which are necessary in order to perform the process A 415 or 426 which is a normal image quality improvement process are not acquired, and thus a process B 416 or 427 which is a tentative image quality improvement process is performed.

By examining whether or not a data region (the region 513 or 514 in FIG. 5A) which is necessary in order to perform the process A 415 or 426 which is a normal image quality improvement process on each pixel of the image data acquired region 510 has a common portion with the image data non-acquired region 515, it is possible to understand whether or not the process A 415 or 426 which is a normal image quality improvement process can be performed.

Particularly, in a case where a shape or a size of the data region (corresponding to the region 513 or 514 in FIG. 5A) which is necessary in order to perform the process A 415 or 426 which is a normal image quality improvement process depends on a pixel (convolution calculation using a fixed filter size or a median filter corresponds to this case), a threshold value is set in a distance from the data non-acquired region 515, and thus it is possible to check quickly whether or not a normal image quality improvement process can be performed.

In FIG. 5A, a boundary 516 indicates a boundary between a region 517 on which the process A 415 or 426 which is a normal image quality improvement process can be performed and a region 518 on which the normal image quality improvement process cannot be performed. A distance D between a position (x,y) in the image data acquired region 510 and the image data non-acquired region 515 may be computed as the minimum value of L∞ distances (that is, max(|x−xs|,|y−ys|)) to positions (xs,ys) in the image data non-acquired region 515.

In an image 502 illustrated in FIG. 5B, regions 523 and 524 respectively indicate data regions which are necessary in order to perform the process A 415 or 426 which is a normal image quality improvement process on pixels 521 and 522. Unlike the case of the image 501 illustrated in FIG. 5A, shapes of the regions 523 and 524 are not a square shape or a rectangular shape, but may have these shapes depending on an image quality improvement processing method (even in the convolution calculation or the median filter). Shapes of filters for the pixels 521 and 522 may be different from each other.

In this example, since the region 523 does not have a common portion with an image data non-acquired region 525 (that is, the entire region 523 is included in an image data acquired region 520), it is possible to perform the process A 415 or 426 which is a normal image quality improvement process on the pixel 521 by using information regarding the region 523. On the other hand, since a part of the region 524 overlaps the image data non-acquired region 525, the process A 415 or 426 which is a normal image quality improvement process cannot be performed on the pixel 522 by using information regarding the region 524, and thus a tentative image quality improvement process is performed. The reference numeral 526 indicates a boundary between the region 527 in which the normal image quality improvement process can be performed and the region 528 in which the normal image quality improvement process cannot be performed.

As mentioned above, in a case where a shape of the data region is not a square shape or a rectangular shape, such as the region 523 or 524, or differs depending on a pixel, a shape of the boundary 526 between the region 527 in which the normal image quality improvement process can be performed and the region 528 in which the normal image quality improvement process cannot be performed is more complicated than in a case of the boundary 516 illustrated in FIG. 5A.

The image quality improvement process may be divided into several processes such as a noise removal process and a sharpening process. For each process, a region may be divided into a region on which the process A 415 or 426 which is the normal image quality improvement process can be performed and a region on which the process A 415 or 426 which is the normal image quality improvement process cannot be performed, and each processing method (image processing algorithm) or a processing parameter may be determined on the basis of a result thereof.

FIG. 6A is a diagram illustrating a method of performing an image quality improvement process by dividing a data acquired region into two or more regions on the basis of a distance from a data non-acquired region, and illustrates another example which is different from FIG. 4. An image 601 corresponds to a captured image and a region division result at a certain time point t. The reference numeral 615 indicates an image data non-acquired region, and an image data acquired region 610 including regions 611, 612, 613 and 614 is divided on the basis of a distance from the data non-acquired region 615.

An image quality improvement process in a case of FIG. 6A includes an image processing algorithm a (for example, a noise removal process) and an image processing algorithm b (for example, a sharpening process), and a region on which a normal process can be performed and a region on which a tentative process can be performed may be obtained for each image processing algorithm.

A region 611 is a region on which a process A 621 is performed as the normal process for both of the algorithm a and the algorithm b; a region 612 is a region on which the normal process is performed for only the algorithm b, and the process B is performed as the tentative process for the algorithm a; the region 613 is a region on which the normal process is not performed for either of the algorithm a and the algorithm b, and a process B' is performed as the tentative process for both of the algorithms; and a region 614 is a region in which there is a high probability that a favorable result may not be obtained and a pseudo-pattern or the like may be generated even if the tentative process is performed for both of the algorithm a and the algorithm b.

In the image quality improvement process, the normal process is performed on each pixel of the region 611 as the process A 621 as illustrated in FIG. 6B for both of the algorithm a and the algorithm b. As the process B 622, on each pixel of the region 612, the tentative process is performed for the algorithm a, and the normal process is performed for the algorithm b. As the process B', on each pixel of the region 613, the tentative process is performed for both of the algorithm a and the algorithm b. In addition, the image quality improvement process is not performed on each pixel of the region 614, and display is not performed either. In other words, the region 614 is treated in the same manner as the data non-acquired region 615.

Since the normal process cannot be performed for the algorithm a, if the image data acquired region 610 is divided from the viewpoint of whether or not the normal process can be performed in the entire image quality improvement process, the region 612 is sorted as a region side on which the tentative process is performed. However, in a case where the image quality improvement process includes a plurality of processes (in the example illustrated in FIG. 6A, the algorithm a and the algorithm b), as in the present example, a region is divided into a region on which the normal process can be performed and a region on which the normal process cannot be performed for each process, and when the algorithm b is executed on the region 612, the normal process may be performed. In other words, the number of regions on which the tentative process is performed can be reduced for each image processing method (image processing algorithm), and thus it is possible to obtain an image with high visibility.

FIG. 7 is a diagram illustrating an example of a process flow for the method of performing an image quality improvement process by dividing a data acquired region into two or more regions on the basis of a distance from a data non-acquired region. The example illustrated in FIG. 7 corresponds to the processes in steps S103 to S105 in FIG. 1.

In FIG. 7, as a process corresponding to step S102 in FIG. 1, in step S711, a processing parameter set by an operator is input to the image quality improvement unit 225 from the input/output unit 221 in step S711; in step S712, information regarding a position at which the surface of the sample 206 is scanned with the charged particle beam 203, acquired from control information of the control unit 222 for the beam deflector 209; and, in step S713, a threshold value (a threshold value around a data non-acquired region) for a distance from the data non-acquired region is computed by using the input processing parameter information and the scanning position information. It is possible to determine whether or not a focused pixel in an image data acquired region is located around the data non-acquired region on the basis of the calculated threshold value. The threshold value around the data non-acquired region may be obtained for each algorithm as described in FIG. 6A.

Next, as a process corresponding to step S103 in FIG. 1, in step S714, a captured image 701 obtained by the charged particle image acquisition device 201 imaging the sample 206 is input to the image quality improvement unit 225, and, in step S715, a region of the captured image 701 which is input in step S714 is divided by using the threshold value around the data non-acquired region, calculated in step S713.

Successively, as a process corresponding to step S104 in FIG. 1, in step S716, an image processing method and a processing parameter are determined according to the process A and the process B for each separate region of the captured image 701, and, in step S717, an image 704 is created which is divided into the respective regions and to which information regarding the image processing method and the processing parameter for each region is attached.

Next, as a process corresponding to step S105 in FIG. 1, in step S718, an image quality improvement process is performed by using the information regarding the image processing method and the processing parameter for each region attached to the image 704 created in step S717, and, in step S719, an image quality improvement result is obtained, and is displayed on a screen of the input/output unit 221. The process is performed at a predetermined time interval (for example, t, t+Δt, t+2Δt, . . . ). The time interval may not be an equal interval.

In step S716 of determining an image processing method and a processing parameter, an image processing method and a processing parameter are defined in advance in each case of the normal image quality improvement process and the tentative image quality improvement process as illustrated in FIG. 6B, and, in step S717 of attaching an image processing method and a processing parameter for each separate region, an image processing method and a processing parameter are determined according to a region division result. For example, first, an image processing method and a processing parameter for the process A 415, 426 or 621 which is the normal image quality improvement process are determined by using the processing parameter input in step S711.

Next, an image processing method and a processing parameter for the process B 416, 427 or 622 which is the tentative image quality improvement process are determined. An image processing method for the process B 416, 427 or 622 which is the tentative image quality improvement process is a method which can be applied even if all data are not acquired. For example, a filtering method is changed so that pixels in the data non-acquired regions 414, 425 and 615 are excluded from filter application targets.

A processing parameter for the process B 416, 427 or 622 which is the tentative image quality improvement process is set to a small value which does not cause, for example, a pseudo-pattern. As a more specific example, in a case where a filter size for a smoothing process with a value such as 15 is input as the processing parameter input in step S711, the smoothing process is performed by using a filter size of 15 in the process A 415, 426 or 621 which is the normal image quality improvement process, but a filter size is set to 3 which is smaller than 15 in the process B 416, 427 or 622 which is the tentative image quality improvement process. In this case, the degree of smoothing is reduced, but an image close to a captured image is output, and thus an unnatural result is hardly obtained.

The image 704 to which the image processing method and the processing parameter are attached branches into two images according to the region division result in step S717, one image proceeds to step S718 and undergoes an image quality improvement process, and the other image 704 is delayed in step S720. Next, the image 704 delayed in step S720 is sent to steps S715 and S716.

In steps S715 and S716, region division (step S715) and determination of an image processing method and a processing parameter (step S716) are performed without using information regarding the image 704 delayed in step S720, and, next, results thereof are compared with the information regarding the image 704, and thus a region on which the same process as the previous process is performed is extracted. This extracted region may be regarded as a process unnecessary region described with reference to FIG. 4. Information regarding the process unnecessary region is attached to the image 704 which is then sent to step S718, and thus an image quality improvement process on the process unnecessary region may be skipped when the image quality improvement process is performed in step S718. Consequently, it is possible to minimize the number of regions on which the image quality improvement process is performed in the image 704, and thus it is also possible to reduce a processing time and to rapidly display a processing result.

Example 2

Next, with reference to FIGS. 8A to 12, a description will be made of a method of performing an image quality improvement process in a case where a processing parameter is changed at a certain time point according to a second embodiment.

FIGS. 8A to 8D are diagrams illustrating one Example of a method of performing an image quality improvement process in a case where a processing parameter is changed at a certain time point. An image 801 corresponds to a captured image and a region division result at a time point t. A processing parameter P is assumed to be used at the time point t (a plurality of processing parameters are typically used, but a collection thereof is referred to as P). In this case, a process X: 813 is performed on a data acquired region 811, and an image 802, including an image quality improvement region 8021 is obtained as a result of improved image quality.

The reference numeral 812 indicates a data non-acquired region, and a region 8121 in the image 802 is an unprocessed region corresponding to the data non-acquired region 812. Although not illustrated in FIG. 8A, actually, as described in FIG. 4A, the data acquired region 811 is divided into a plurality of regions, and an image quality improvement process is performed on each region. It is assumed that a processing parameter is changed from P to Q immediately after the time point t (the processing parameters P and Q are assumed to be different values).

An image 803 in FIG. 8B corresponds to a captured image and a region division result at a time point t+Δt. A processing parameter at the time point t+Δt is Q. Image quality improvement results using the processing parameter Q are preferably displayed for all data acquired regions if possible, but this is often difficult since a process is delayed. Therefore, an image quality improvement process using the processing parameter Q is performed on as wide a region as possible in a range of being in time for processing, and a result thereof is displayed. In this case, since a user often focuses on the vicinity of a scanning position, an image quality improvement result for the vicinity of the scanning position is preferentially displayed. Therefore, in the image 803, an image quality improvement process using the processing parameter Q is performed on a region 822 close to a scanning position according to a process Y: 824.

On the other hand, a process is not performed on a region 821 regardless of whether a normal image quality improvement process was performed or a tentative image quality improvement process was performed at the time point t. In other words, even if a tentative image quality improvement process using the processing parameter P at the time point t, and then a normal image quality improvement process is scheduled to be performed at the subsequent time point, since the processing parameter is changed from P to Q at the time point t+Δt, the scheduled process, that is, the normal image quality improvement process using the processing parameter P is not performed. As a result, as an image 804 obtained as a result of improving image quality, an image is obtained which includes an image quality improvement region 8041 formed of a region on which a process X: 813 is performed and an image quality improvement region 8042 formed of a region on which a process Y: 824 is performed. A region 8231 in the image 804 is an unprocessed region corresponding to a data non-acquired region 823.

An image 805 in FIG. 8C corresponds to a captured image and a region division result at a time point t+2Δt after time elapses. A processing parameter is still Q. In this case, an image quality improvement process using the processing parameter Q is performed on the region 832 and the region 834 for which image quality improvement results at the processing parameter Q are not obtained yet, according to a process Y: 836. On the other hand, a region such as the region 831 whose distance from the data non-acquired region 835 is long is still set as a process unnecessary region, and a process is not performed thereon. The region 833 is a region for which an image quality improvement result at the processing parameter Q has already been obtained, and thus a process is not performed on this region 833 as a process unnecessary region.

In an image 806 indicating an image quality improvement result, an image of a region 8062 is obtained as an image quality improvement result at the processing parameter Q with respect to each of the regions 832, 833 and 834. On the other hand, a region 8061 is a region corresponding to the process unnecessary region 831 on which the image quality improvement process has already been performed. A region 8351 in the image 806 is an unprocessed region corresponding to a data non-acquired region 835.

When the images 804 and 806 having undergone the image quality improvement process are compared with each other, a region in which an image quality improvement result at the processing parameter Q is obtained is wider than on the image 806 side. Hereinafter, the same process is performed at time points t+3Δt, t+4Δt, and the like, and image quality improvement results at a processing parameter B are displayed for all data acquired regions after sufficient time elapses.

An image 807 in FIG. 8D corresponds to a captured image and a region division result at the time point t+2Δt in the same manner as the image 805 in FIG. 8C, but indicates a case where a processing parameter is further changed from Q to R immediately after the time point t+Δt (the processing parameters P, Q and R are different values). In this case, in the same manner as a case where a processing parameter is changed to Q, a process is performed so that an image quality improvement result at the processing parameter R is preferentially displayed for as wide a region as possible from the vicinity of a scanning position.

In particular, an image quality improvement process using the processing parameter R is performed on a region 843 whose distance from a data non-acquired region 844 is less than a threshold value, according to a process Z: 845, and thus an image 808 including an image quality improvement process region 8032 is obtained as an image quality improvement result. Both regions 8081 and 8082 respectively correspond to regions 841 and 842, and have undergone an image quality improvement process so as to be used as process unnecessary regions. In regions 841 and 842, image quality improvement results at the processing parameters P and Q are obtained. A region 8441 in the image 808 is an unprocessed region corresponding to a data non-acquired region 844 in the image 808.

At the time point t+Δt, the image quality improvement process using the processing parameter Q is being performed, but, this process is stopped, and a process using the processing parameter R is preferentially performed. Thereafter, in a case where the processing parameter R is not changed yet, a process is performed so that image quality improvement results at the processing parameter R are displayed for all data acquired regions after sufficient time elapses. In addition, for example, in a case where a processing parameter is changed to P immediately after the time point t+2Δt, the image 802 obtained as the image quality improvement result at the processing parameter P illustrated in FIG. 8A may be used. An image quality improvement result obtained in the past may be stored, and a result at a corresponding processing parameter may be displayed as necessary.

FIGS. 9A and 9B are diagrams illustrating one Example of a method, different from FIG. 8, of performing an image quality improvement process in a case where a processing parameter is changed at a certain time point. Although not illustrated in FIGS. 9A and 9B, actually, as described in FIGS. 4A and 4B, a data acquired region is divided into a plurality of regions, and an image quality improvement process is performed on each region.

An image 901 and an image 902 in FIG. 9A are respectively the same as the image 801 and the image 802 in FIG. 8A. However, it is assumed that a point of interest 914 is designated as a focused point on the image 901 by the user. A region 911 in the image 901 is a data acquired region, and a region 912 is a data non-acquired region. Here, an image quality improvement process using the processing parameter P is performed on image data acquired in the region 911 according to a process X: 913, and thus the image 902 including an image quality improvement process region 9021 is obtained. A region 9121 in the image 902 is an unprocessed region corresponding to a data non-acquired region 912 in the image 901.

Here, in the same manner as in FIG. 8B, it is assumed that a processing parameter is changed from P to Q immediately after the time point t (a time point before the time point t+Δt) at which the image 801 is acquired (the processing parameters P and Q are assumed to be different values).

An image 903 in FIG. 9B corresponds to a captured image and a region division result at the time point t+Δt. Unlike the case of the image 803 in FIG. 8B, a region 911 in which the image data in FIG. 9A is acquired is divided into a region 922 located around a point of interest 914 and a remaining region 921 as illustrated in FIG. 9B, an image quality improvement process using the processing parameter Q is performed on the region 922 according to a process Y: 924, and is not performed on the region 921. A region 923 is an image data non-acquired region. As a result, an image 904 obtained as a result of improving image quality includes a region 925 which displays an image quality improvement result processed by using the processing parameter Y, a region 926 which displays an image quality improvement result processed on the region 911 of the image 901 acquired at the time point t by using the processing parameter P, and a region 927 which displays a captured image as it is.

In a case where the point of interest 914 is designated as mentioned above, an image quality improvement process is preferentially performed on the vicinity thereof, and thus a processing result for the focused point 914 can be rapidly displayed. Consequently, the user can promptly find the processing parameter Q which causes image quality at the focused point 914 to be improved.

In a case where a point of interest is not designated, a scanning position is regarded as a point of interest, and thus processes equivalent to the processes described in FIGS. 8A to 8D may be performed. Definition of a distance may be changed, for example, in a case where a point of interest is designated, L∞ distances are used, and, in a case where a point of interest is not designated, a difference between y coordinates is used as a distance (actually, in FIGS. 8A to 8D, a difference between y coordinates is used as a distance, and, in FIGS. 9A and 9B, L∞ distances are used). In addition, a point of interest may be a region having an area, and a plurality of points or regions may be present. As in a region 927 illustrated in FIG. 9B, a captured image may be displayed in some regions without being changed. In a case where a processing parameter is changed, and then a focused point is changed, the vicinity of the changed focused point is preferentially processed.

FIG. 10 is a diagram illustrating one Example of a process flow for the method of performing an image quality improvement process by dividing a data acquired region into two or more regions on the basis of a distance from a data non-acquired region. The same processes or images as in the process flow described in FIG. 7 are given the same reference numerals. A great difference from the process flow described in FIG. 7 is that a database 1001 preserving an image quality improvement process result is provided. Image quality improvement results at other processing parameters are stored in the database 1001, and if a result corresponding to a processing parameter designated in step S711 is stored in the database 1001, the result is used.

In a process in step S7151 of performing region division or in a process in step S7161 of determining an image processing method and a processing parameter for each separate region, it is examined whether or not there is a corresponding image quality improvement result in the database 1001, and in case of yes, an image quality improvement process result may be obtained in step S7191 by using a result of performing an image quality improvement process in step S7181 on an image 1013 in which a processing method and parameter are determined for each separate region in step S7171.

Consequently, particularly, in a case where a processing parameter is frequently changed, it is possible to effectively use a result of an image quality improvement process performed in the past.

FIGS. 11A to 11C are diagrams for explaining a method of performing an image quality improvement process in a case where a plurality of processing parameters of different kinds are changed. Although not illustrated in FIGS. A to 11C, actually, as described in FIGS. 4A and 4B, a data acquired region is divided into a plurality of regions, and an image quality improvement process is performed on each region.

FIG. 11A is the same as FIG. 8A. A region 1111 in the image 1101 is a data acquired region, and a region 1112 is a data non-acquired region. Here, an image quality improvement process using the processing parameter P is performed on image data acquired in the region 1111 according to a process X: 1113, and thus the image 1102 including a region 11021 having undergone the image quality improvement process is obtained. Here, parameters $\alpha_1$ and $\beta_1$ are set as processing parameters used for the image quality improvement process. Hereinafter, values $\alpha_k$ and $\beta_k$ of the processing parameters $\alpha$ and $\beta$ are arranged and are indicated as in ($\alpha_k$, $\beta_k$).

It is assumed that processing parameters are changed from ($\alpha_1$, $\beta_1$) to ($\alpha_2$, $\beta_1$) immediately after the time point t (a time point before the time point t+$\Delta$t) at which the image 1101 is acquired ($\alpha_1$ and $\alpha_2$ are assumed to be different values). In this case, in the same manner as in FIG. 8B, an image quality improvement process using the processing parameters ($\alpha_2$, $\beta_1$) is performed on a region 1122 in an image 1103 illustrated in FIG. 11B according to a process Y: 1124, and thus an image 1104 including a region 11041 having undergone the image quality improvement process is obtained. On the other hand, a process is not performed on a region 1121 regardless of whether a normal image quality improvement process was performed or a tentative image quality improvement process was performed at the time point t at which an image 1101 is acquired, and an image of a region 11021 in which an image quality improvement process is performed on the image 1101 obtained at the time point t is used. A region 1123 is an image data non-acquired region.

It is assumed that processing parameters are changed from ($\alpha_2$, $\beta_1$) to ($\alpha_2$, $\beta_2$) immediately after the time point t+$\Delta$t (a time point before the time point t+2$\Delta$t) at which the image 1103 is acquired ($\beta_1$ and $\beta_2$ are assumed to be different values). Here, when compared with a case where an image quality improvement result is obtained after the parameter $\alpha$ is changed to $\alpha_2$, an image quality improvement result is obtained within a very short period of time after the parameter $\beta$ is changed to $\beta_2$. As an example of this case, there may be a case where the parameter $\alpha$ corresponds to a process whose time is long, and the parameter $\beta$ corresponds to a process whose time is short, or a case where the value $\beta_2$ indicates a process to be skipped, and a corresponding result can be easily output.

If the method described with reference to FIGS. 8A to 8D is used, image quality improvement results at the processing parameters ($\alpha_2$, $\beta_2$) are obtained, but an image quality improvement result at the parameter $\beta_2$ which can be obtained in a short period of time may be first displayed.

In an example of an image 1105 illustrated in FIG. 11C, an image data acquired region is divided into a region 1131, a region 1132, a region 1133, and a region 1134. A region 1135 is an image data non-acquired region. The region 1131 is a region corresponding to the region 1111 on which the image quality improvement process using the processing parameters ($\alpha_1$, $\beta_1$) is performed according to the process X: 1113 in the image 1101 acquired at the time point t illustrated in FIG. 11A, and an image quality improvement process using the processing parameters ($\alpha_1$, $\beta_2$) is performed according to a process Y: 1136 so that a region 11061 having undergone the image quality improvement process is obtained.

The region 1132 is a region corresponding to the region 1122 on which the image quality improvement process using the processing parameters ($\alpha_2$, $\beta_1$) is performed according to the process Y: 1124 in the region 1122 acquired at the time point t+$\Delta$t illustrated in FIG. 11B, and an image quality improvement process using the processing parameters ($\alpha_2$, $\beta_2$) is performed according to a process Z: 1137 so that a region 11062 having undergone the image quality improvement process is obtained.

The regions 1133 and 1134 are new regions in which data is acquired between the time point t+$\Delta$t and the time point t+2$\Delta$t, and an image quality improvement process using the processing parameters ($\alpha_2$, $\beta_2$) is performed on the region 1134 according to a process W: 1139 so that a region 11064 having undergone the image quality improvement process is obtained. On the other hand, an image quality improvement process using processing parameters ($\alpha_0$, $\beta_2$) is performed on the region 1133 according to a process V: 1138 so that a region 11063 having undergone the image quality improvement process is obtained.

Consequently, an image 1106 whose image quality is improved is obtained. Here, $\alpha_0$ indicates a value of a parameter which causes a process to be performed at a high speed, for example, by not performing a process corresponding to the parameter $\alpha$. Consequently, an image quality improvement process is performed by using a processing parameter in which a value of the parameter $\beta$ is $\beta_2$ for all data acquired regions. In addition, if there is a surplus in the computer power, an image quality improvement process is performed on some regions such as the region 1134 by setting the parameter $\alpha$ to $\alpha_2$. In the present example, an example has been described in which an image quality improvement process is performed between the time point t+Δt and the time point t+2Δt by using a processing parameter in which a value of the parameter β is $β_2$ for all data acquired regions, but, in a case where the computer power is relatively insufficient, a process using the value $β_2$ is performed on some regions, and remaining regions may be processed after the next time point.

As mentioned above, an image quality improvement process is performed by preferentially using an easily reflected parameter, and thus a user's waiting time can be reduced.

FIG. 12 is a diagram illustrating one Example of a process flow for a method of realizing the process described in FIG. 11 in the method of performing an image quality improvement process by dividing a data acquired region into two or more regions on the basis of a distance from a data non-acquired region. The same reference numerals are given to steps of performing the same processes as those in the process flow described in FIG. 10.

In the process flow illustrated in FIG. 12, image quality improvement results at other processing parameters are stored in a database 1201, and if a result corresponding to a processing parameter designated in step S711 is stored in the database 1201, the result is used. In a process in step S1211 (corresponding to step S7151 in FIG. 10) of performing region division or in a process in step S1212 (corresponding to step S7161 in FIG. 10) of determining an image processing method and a processing parameter for each separate region, in a case where it is examined whether or not there is a corresponding image quality improvement result in the database 1201, the processing method and determined parameter for each separate region are attached to an image 1220 in step S1213, and an image quality improvement process 1230 is performed.

In the process flow illustrated in FIG. 12, a great difference from the process flow described in FIG. 10 is that the image quality improvement process in step S7181 described in FIG. 10 is divided into a plurality of steps including steps S1214 to S1216 as the image quality improvement process 1230 in the process flow illustrated in FIG. 12, and the database 1201 is accessed in each of the steps. Results of steps S1214 and S1215, that is, interim results in the image quality improvement process 1230 are stored in the database 1201. In a case where some processing parameters are changed in step S1212, there is a case where a process may be performed by using information regarding the interim results stored in the database 1201 in steps S1214 and S1215 of the image quality improvement process 1230, and, in this case, it is possible to effectively use the interim results stored in the database 1201.

For example, it is assumed that the parameters α and β in the description of FIGS. 11A to 11C are respectively parameters corresponding to an image quality improvement process 1 in step S1214 and an image quality improvement process 3 in step S1216. In a case where image quality improvement results at the processing parameters $(α_1, β_1)$ have already been computed, and data regarding the results is registered in the database 1201, only the image quality improvement process 3 in step S1216 may be performed again when the processing parameters are changed to $(α_1, β_2)$. In other words, in this case, step S1216 may be executed according to the parameter $β_2$ by using the result of the image quality improvement process 2 in step S1215, stored in the database 1201.

In the process in step S1211 of performing region division or the process in step S1212 of determining a processing method and a processing parameter for each separate region, it is determined whether or not the interim results stored in the database 1201 can be used in steps S1214 and S1215 of the image quality improvement process 1230 on the basis of a provided processing parameter or information stored in the database 1201.

FIG. 13 is a diagram illustrating an example of a GUI screen 1300 for an image quality improvement process on an image during scanning, displayed on the screen of the input/output unit 221 illustrated in FIG. 2A. In the present example diagram, the GUI screen 1300 is formed of a region 1321 for setting processing parameters, a region 1322 for setting a distance from a data non-acquired region or a point of interest, and an image display region 1311 (in addition, in the present specification, an item which is necessary in order to set a distance is regarded as a part of a processing parameter, and, for example, the processing parameter set by the operator in step S711 includes an item which is necessary in order to set a distance).

In the region 1321, a slider 1302 or a text box 1303 is located beside a name 1301 of each parameter, and thus a value of each parameter can be changed. In addition, a default button 1304 for returning each parameter to a default value is provided.

In the region 1322, setting may be performed on both of a case where the vicinity of a scanning position is preferentially processed and a case where a point of interest is preferentially processed, displayed in a column of an item 1305. A prioritized matter is set by using a drop-down list 1306 located beside the item 1305 in order to complete definition of a distance. In addition, points of interest such as the reference numerals 1312 and 1313 may be set by using the image display region 1311. For example, a point of interest is set by clicking a left button of a mouse. A point of interest may be canceled by clicking a right button of the mouse, for example. Further, an image quality improvement process may be switched between ON and OFF by using a checkbox 1323.

In a case where the checkbox 1323 is not checked, a captured image is displayed instead of an image quality improvement result in the image display region 1311. A processing parameter may be reflected in an image quality improvement process from the moment of changing the processing parameter in the region 1321, and the processing parameter may be reflected when a button (not illustrated in the present example diagram) for performing the reflection is pressed.

The example illustrated in FIG. 13A shows a state in which a currently captured image is displayed in the image display region 1311. A region 1314 indicates an imaged region, and a region 1315 indicates a not imaging region. The entire region of interest 1312 and the region displayed in a solid line within a boundary of the focused region 1313 are regions on which the process A: 415 or 426 or the process X: 813 or 1113 corresponding to an image quality improvement process has been performed. On the other hand, the region displayed in a dotted line on the lower side of the focused region 1313 is close to the not imaging region 1315, and thus indicates a region on which the process B: 416 or 427 or the process Y: 824 or 1124 has been performed.

On the other hand, FIG. 13B illustrates an image captured after time elapses from the time point at which the image displayed in the image display region 1311 in FIG. 13A is captured. A state is shown in which the region 1314 is increased, the region 1315 which is a not imaging region is reduced, and a distance between a boundary 1316 of the regions 1314 and 1315 and the region of interest 1313 becomes longer than in the case of FIG. 13A. In this state, a distance between the lower region of the focused region 1313 and the not imaging region 1315 is increased, and thus the process A: 415 or 426 or the process X: 813 or 1113 is performed on the lower region of the region of interest 1313 displayed in the dotted line in FIG. 13A. As a result, the lower region of the region of interest 1313 displayed in the dotted line in FIG. 13A is displayed in a solid line in FIG. 13B.

As described above, since the screens 1321 and 1322 for prompting a processing parameter to be set and the image display screen 1311 are disposed to be close to each other, it is possible to change the processing parameter while viewing an image quality improvement result and thus to find an appropriate processing parameter with high efficiency.

REFERENCE SIGNS LIST

101 LOOP START, 102 PROCESS OF SCANNING SOME REGIONS WITHIN VISUAL FIELD, 103 PROCESS OF DIVIDING DATA ACQUIRED REGION INTO TWO OR MORE REGIONS, 104 PROCESS OF DETERMINING PROCESSING METHOD AND PROCESSING PARAMETER FOR EACH REGION, 105 PROCESS OF PERFORMING IMAGE QUALITY IMPROVEMENT ON EACH REGION, 106 PROCESS OF DISPLAYING IMAGE QUALITY IMPROVEMENT RESULT, 107 LOOP END, 201 BEAM IRRADIATION/DETECTION DEVICE, 202 SCANNING CHARGED PARTICLE GUN, 203 SCANNING CHARGED PARTICLE BEAM, 204 CONDENSER LENS, 205 OBJECTIVE LENS, 206 SAMPLE, 207 STAGE, 208 DETECTOR, 209 BEAM DEFLECTOR, 221 INPUT/OUTPUT UNIT, 222 CONTROL UNIT, 223 PROCESSING UNIT, 224 STORAGE UNIT, 225 IMAGE QUALITY IMPROVEMENT UNIT, 226 REGION DIVISION PORTION, 227 PROCESSING METHOD/PROCESSING PARAMETER CONTROL PORTION, 228 IMAGE QUALITY IMPROVEMENT PROCESS EXECUTION PORTION

The invention claimed is:

1. A method of improving image quality of an image obtained by imaging a sample with a scanning charged particle microscope, the method comprising:
   a scan step of imaging the sample while scanning and irradiating some regions of the sample within an imaging visual field of the scanning charged particle microscope with a focused charged particle beam, so as to sequentially acquire image data of the sample;
   a region dividing step of dividing a region in which the image data is acquired into two or more regions among regions within the imaging visual field of the scanning charged particle microscope which sequentially acquires the image data in the scan step, on the basis of a distance from a region in which the image data is not acquired;
   a processing method and processing parameter determining step of determining an image quality improvement processing method and a processing parameter for image quality improvement according to the regions obtained through the division in the region dividing step for the image data in each of the separate regions;
   an image quality improvement step of performing an image quality improvement process on the image data in each region obtained through the division in the region dividing step by using the processing method and the processing parameter corresponding to the separate region, determined in the processing method and processing parameter determining step; and
   an image quality improvement result display step of displaying an image having undergone the image quality improvement process in the image quality improvement step,
   wherein steps from the scan step to the image quality improvement result display step are iterated until scanning of a region of the sample within the visual field of the scanning charged particle microscope is completed.

2. The method of improving image quality in a scanning charged particle microscope according to claim 1,
   wherein, in the image quality improvement result display step, some regions located around a scanning position among data acquired regions are not displayed.

3. The method of improving image quality in a scanning charged particle microscope according to claim 1,
   wherein, in the region dividing step, a region in which the same process result as the image quality improvement result in the previous iteration is obtained is extracted as a process unnecessary region, and, in the image quality improvement step, an image quality improvement process is not performed on the process unnecessary region.

4. The method of improving image quality in a scanning charged particle microscope according to claim 1, further comprising:
   a processing parameter reading step of reading a processing parameter in the present iteration,
   wherein, in the region dividing step, a dividing method is determined by using a processing parameter in the present iteration, and a processing method or a processing parameter determined for each region in the processing method and processing parameter determining step before the previous iteration.

5. The method of improving image quality in a scanning charged particle microscope according to claim 4,
   wherein, in the region dividing step, a process using a processing parameter in the present iteration is preferentially performed on a pixel whose distance from a point of interest within the imaging visual field which is predefined is short.

6. The method of improving image quality in a scanning charged particle microscope according to claim 4, further comprising:
   an image quality improvement result preserving step of preserving the image quality improvement result and a process interim result in the image quality improvement step,
   wherein, in the image quality improvement step, an image quality improvement process is performed on one or more regions among the regions obtained through the division in the region dividing step, by using the interim result.

7. The method of improving image quality in a scanning charged particle microscope according to claim 4,
   wherein, in a case where the processing parameter determined in the processing method and processing parameter determining step is changed during iteration from the scan step to the image quality improvement result display step, an image quality improvement process using the changed processing parameter is sequentially performed from a region whose distance from a focused point within the predefined imaging visual field is short.

8. A scanning charged particle microscope apparatus comprising:
- charged particle irradiation optical unit which irradiates and scans a sample with focused charged particles;
- detection optical unit which detects particles of the same kind or different kinds generated from the sample which is irradiated with the charged particles by the charged particle irradiation optical unit;
- image quality improvement unit which performs an image quality improvement process on image data which is obtained by the detection optical unit detecting the particles generated from the sample; and
- image display unit which displays a result of the image quality improvement process,
- wherein the image quality improvement unit iterates, on image data within an imaging visual field acquired by the charged particle optical unit scanning and irradiating the sample with focused charged particles, dividing a region in which the image data is acquired into two or more regions on the basis of a distance from a region in which the image data within the visual field is not acquired; determining an image quality improvement processing method and a processing parameter for image quality improvement for the image data in each of the separate regions according to the separate regions; and performing an image quality improvement process on the image data in each of the separate regions by using the determined processing method and processing parameter corresponding to the separate region.

9. The scanning charged particle microscope apparatus according to claim 8,
- wherein the display unit does not display some regions located around a scanning position among data acquired regions when the image quality improvement result is displayed.

10. The scanning charged particle microscope apparatus according to claim 8,
- wherein the image quality improvement unit extracts a region in which the same process result as the image quality improvement result in the previous iteration is obtained from among the two or more separate regions as a process unnecessary region, and does not perform an image quality improvement process on the extracted process unnecessary region.

11. The scanning charged particle microscope apparatus according to claim 8,
- wherein the image quality improvement unit determines a division method of dividing the region into the two or more regions by using a processing parameter in the present iteration, and a processing method or a processing parameter determined for each region in the processing method and processing parameter determining step before the previous iteration.

12. The scanning charged particle microscope apparatus according to claim 11,
- wherein the image quality improvement unit preferentially performs a process using a processing parameter in the present iteration on the two or more separate regions by a pixel whose distance from a focused point within the imaging visual field which is predefined is short.

13. The scanning charged particle microscope apparatus according to claim 11,
- wherein the image quality improvement unit further preserves the image quality improvement result and a process interim result in the image quality improvement, and performs an image quality improvement process on one or more regions among the separate regions by using the preserved interim result.

14. The scanning charged particle microscope apparatus according to claim 8,
- wherein, in a case where the processing parameter is changed during the iteration, the image quality improvement unit sequentially performs an image quality improvement process using the changed processing parameter from a region whose distance from a focused point within the predefined imaging visual field is short.

* * * * *